United States Patent [19]

Kimura et al.

[11] Patent Number: 4,931,425
[45] Date of Patent: Jun. 5, 1990

[54] PROCESS FOR CHEMICAL VAPOR DEPOSITION OF SUPERCONDUCTIVE OXIDE

[75] Inventors: Takafumi Kimura, Hiratsuka; Hideki Yamawaki, Isehara; Kazuto Ikeda, Atsugi; Masaru Ihara, Chigasaki, all of Japan

[73] Assignee: Fujitsu Limited, Kawasaki, Japan

[21] Appl. No.: 249,653

[22] Filed: Sep. 27, 1988

[30] Foreign Application Priority Data

Oct. 9, 1987 [JP] Japan .............................. 62-255677
Apr. 8, 1988 [JP] Japan .............................. 63-087629

[51] Int. Cl.$^5$ ......................... C23C 16/00; B05D 5/12
[52] U.S. Cl. ........................................... 505/1; 427/62; 427/255.3; 427/255.2; 427/255.1; 427/255; 427/248.1; 427/314; 505/730
[58] Field of Search ................ 427/62, 63, 255, 255.1, 427/255.2, 255.3, 248.1, 314; 505/730, 818, 819

[56] References Cited

U.S. PATENT DOCUMENTS 3,982,049 9/1976 Mee et al. ..................... 427/255.3
4,699,800 10/1987 Dustmann et al. ............... 427/255.3

FOREIGN PATENT DOCUMENTS 63-225528 9/1988 Japan .

OTHER PUBLICATIONS

Bednorz et al., "Possible High Tc Superconductivity in the Ba—La—Cu—O System", Z. Phys. B–Condensed Matter 64, p. 189-193 (1986).
Maeda et al., "A New High-Tc Oxide Superconductor without a Rare Earth Element", Jpn. J. Appl. Phys., vol. 27, No. 2, Feb., 1988, p. 209-210.
Osofsky et al., "Experimental Program on High Tc Oxide Superconductors at the Naval Research Laboratory", MRS Conf. Proc. 4/23/87, p. 173-175.
Hammond et al., "Superconducting Thin Films of the Perovskite Super-Conductors by Electron-Beam Deposition", MRS Conf. Proc. 4/23/87, p. 169-171.
Mogro-Campero et al., "Superconducting Y—Ba—Cu—O Thin Films by Evaporation", MRS Pittsburgh, April, 1988, p. 113-116.
Berry et al. "Formation of High Tc Superconducting Films by Organo-Metallic Chemical Vapor Deposition", Appl. Phys. Lett. 52 (20) May, 1988, p. 1743-1745.

Primary Examiner—Norman Morgenstern
Assistant Examiner—Roy V. King
Attorney, Agent, or Firm—Staas & Halsey

[57] ABSTRACT

A thin film of a high temperature superconductive oxide of rare earth metal-alkali earth metal-copper-oxygen system or group VA metal-alkali earth metal-copper-oxygen system, which has an excellent crystallinity, particularly a single crystalline structure, is formed on a substrate by a CVD method, in which halides of the metals and an oxygen source gas are separately flowed over a substrate and caused to react with each other over the substrate, to deposit a desired superconducting oxide film.

60 Claims, 7 Drawing Sheets

PROCESS FOR CHEMICAL VAPOR DEPOSITION OF SUPERCONDUCTIVE OXIDE

BACKGROUND OF THE INVENTION

1. Field of the Invention

The present invention relates to a process for chemical vapor deposition (CVD) of a superconductive oxide, more specifically a process for CVD of a superconductive oxide of (a rare earth metal or a metal of the VA group of the periodic table)-(alkali earth metal)-(copper)-(oxide) system on a substrate.

2. Description of the Related Art

The speed of computers has been remarkably increased, and a multiplication of processors, increase of the switching speed of devices, and a high density packaging of such devices for shortening the length of wiring are carried out to cope with this increase of the speed of computers. A high density wiring or interconnection necessitates fine wiring or interconnection patterns, which decreases the sectional areas of conductors used for the wiring or interconnection but increases the electrical resistance of the wiring or interconnection. This lowers the speed of an electrical signal transmission and distorts the wave-shape thereof.

If a superconductive material can be used as a material for wiring instead of a normal conductor such as copper, the above-mentioned problems will be quickly solved, and if a Josephson element and the like are formed with a superconductive material and integrated, the high speed and low electric power consumption thereof, in combination with a fine packaging art, will allow the realization of a super high speed computer system.

Conventional superconductive materials need a low temperature for transition to a superconductive state and, therefore, must be cooled by liquid helium or liquid hydrogen. Since these cooling mediums are difficult to handle and are expensive, it is practically difficult to use these superconductive materials.

Nevertheless, high temperature superconductive materials, represented by Y-Ba-Cu-O system oxide or ceramics, have been recently developed, and this has opened up new possibilities in the utilization of superconductive materials.

Since oxide superconductors exhibit a superconducting behavior at a relatively high temperature, i.e., higher than the boiling point of liquid nitrogen (77K), oxide superconductors can be widely utilized in, for example, semiconductor devices such as IC's, as parts of various devices, and as wiring in devices a strong demand has arisen for such superconductors. To satisfy this demand, it is necessary to efficiently form a high quality thin film. For example, a semiconductor integrated circuit is composed completely of thin film elements, including a Josephson element, and as a result, the characteristics of a thin film, which depend on the crystallinity thereof, such as crystal size and crystal orientation of the thin film, and the uniformity and reproducibility of the thin film, are important factors determining the yield and reliability of elements and an integrated circuit.

Conventional methods of forming a thin film of a semiconductor material include sputtering and evaporation. In the sputtering process, a target having a composition similar to that of a material to be deposited is used and is vaporized by ion sputtering to be deposited on a substrate. In the evaporation process, a material (source) for forming a thin film is heated until evaporation occurs and is deposited on a substrate.

These conventional thin film forming methods may be applied to a high temperature superconductive material but it is difficult to provide a good crystallinity thin film, particularly a single crystalline thin film, thereby. The sputtering method is suitable for forming a thin film of a single element (Si or a metal) or a simple compound which is not easily decomposed ($SiO_2$, $Al_2O_3$, etc.), but is difficult to form a thin film of a complex compound by sputtering, since such a compound is decomposed by the sputtering, and thus control of a composition is very difficult. In the evaporation process, if a compound composed of multi-elements is used, it is difficult to form a film having a uniform composition, since an element which is easily evaporated is first evaporated and a material which is not easily evaporated remains. Particularly, it is difficult to evaporate a compound such as an oxide and deposit it in a uniform manner. In this regard, a method has been proposed of depositing a film of metals having a ratio between the metals required for a desired metal oxide, followed by oxidizing the metal film. In this method, however, the volume of the film is changed by oxidation, which causes roughness of the surface of the film, peeling of the film, or a nonuniform film quality, and it is difficult to obtain a dense film thereby.

Figure 1:
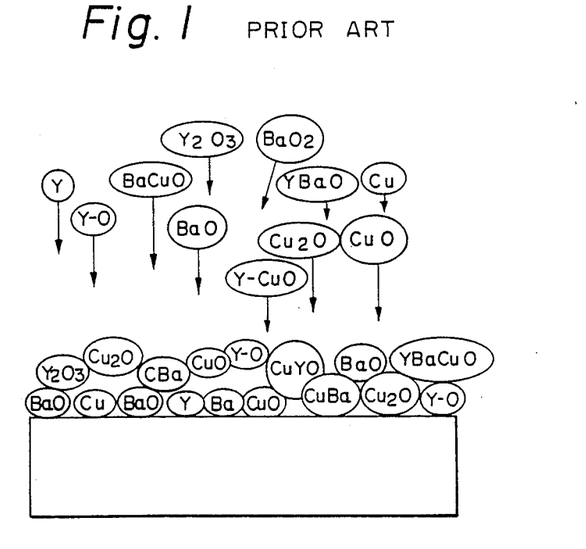
FIG. 1 schematically illustrates the deposition of a Y-Ba-Cu-O system film by sputtering.

In either the sputtering or the evaporation process, it is difficult to form a single crystalline film having a complex composition, since a deposition of discrete metals, alloy and metal oxides or compounds on a substrate occurs. For example, as seen in FIG. 1, when a superconductive oxide of the Y-Ba-Cu-O system mentioned above is formed, discrete metals such as Y, Ba and Cu, various discrete oxides or compounds such as $Y_2O_3$, $BaO_2$, Y-Ba-O, CuO, $Cu_2O$, Y-Cu-O, Y-O, Ba-Cu-O and Ba-O, or alloys, are deposited on a substrate, and as a result, it is difficult to obtain a film of a compound having a desired composition or a good crystallinity, and such a film has a disadvantageously decreased current density and reduced boundary characteristics when made into a fine pattern, and the like, and thus it is not practical for application to a semiconductor integrated circuit.

SUMMARY OF THE INVENTION

The object of the invention is to provide a method of forming a thin film of a high temperature superconductive oxide having an excellent crystallinity, which is applicable to thin film devices such as a semiconductor integrated circuit, etc.

. This and other objects, features, and advantages of the present invention are attained by providing a process for chemical vapor deposition of an oxide superconductive film on a substrate. In this process, the substrate is held in a reaction chamber and heated to a first temperature; a first flow of vapors of a rare earth metal, an alkali earth metal or a halide of an alkali earth metal and a halide of copper having a second temperature equal to or lower than the first temperature is introduced at a position over the substrate in the reaction chamber; a second flow of an oxygen source gas is introduced into the reaction chamber at a position over the substrate; the first and second flows being separated from each other until approaching the substrate, at which point the flows come into contact with each other, and are heated to the first temperature, and react with each other to deposit a superconductive oxide of rare earth metal-alkali earth metal-copper-oxygen system on the substrate. The typical superconductive oxide formed in the above process is represented by the formula $X_1Z_2CuO_x$ where X stands for at least one rare earth metal, Z stands for at least one alkali earth metal, and x has a value different to the stoichiometric value.

In accordance with the present invention, there is also provided a process for chemical vapor deposition of an oxide superconductive film on a substrate, wherein the substrate is kept in a reaction chamber and heated to a first temperature; a first flow of vapors of a halide of a group metal VA of the elemental periodic table, halides of two alkali earth metals, and a halide of copper having a second temperature lower than the first temperature is introduced to a position over to the substrate in the reaction chamber; a second flow of an oxygen source gas is introduced to a position over the substrate in the reaction chamber; the first and second flows being separated from each other until approaching the substrate, at which point the flows come in contact with each other, are heated to the first temperature, and react with each other to deposit a superconductive oxide of a group VA metal of the periodic table - an alkali earth metal - an alkali earth metal-copper-oxide system on the substrate. The typical superconductive oxide formed in this latter process is represented by the formula $QZ^1Z^2Cu_yO_x$, where Q stands for a metal of the V group of the periodic table, $Z^1$ and $Z^2$ stand for an alkali earth metal, y has a value of about 2 or about 1.5, x has a value different from the stoichiometric value.

In the above two chemical formulae, the ratios of metals may be deviated from that in the formulae; typically, within 10% from the formulae.

The first flow is usually produced by flowing a carrier gas such as helium or argon.

The oxygen source gas may be oxygen, air (oxygen-containing gas), water vapor, etc.

Preferably hydrogen is used, as it has an effect of accelerating the reaction for the deposition a superconductive oxide film.

The main feature of the process of the present invention is that (1) source gases or vapors of metals or metal halides and (2) an oxygen source gas are separated until approaching near to a substrate, and that a temperature of the source gases or vapors of metals or metal halides before approaching the substrate is lower than a temperature of the substrate at the point at which the source gases or vapors react with an oxygen source gas.

If the source gases or vapors of metals or metal halides and an oxygen source gas are not separated until nearing a substrate, i.e., come into contact with each other before nearing the substrate, they react with each other to form an oxide there and control of the composition of the source gases or vapors near the substrate, i.e., where a desired reaction should occur becomes impossible.

If a temperature of the source gases or vapors of metals or metal halides is higher than a temperature of the substrate, there must be a portion having a temperature lower than the temperature of the source gases or vapors before the substrate where the source gases or vapors are deposited, making it impossible to control the composition of the source gases or vapors to a desired one near the substrate.

For the same reasons as above, the source gas or vapor should not be cooled before reaching the substrate after it is evaporated from a source thereof at a required temperature, to provide a desired concentration. This is the second important feature of the process of the present invention.

The third important feature of the process of the present invention is that the appropriate temperature ranges of the various source gases or vapors of metals or metal halides, are as follows:

| Source | General range | Preferred range |
|---|---|---|
| $BiCl_3$ | 150–250° C. | 170–200° C. |
| CuCl | 300–500° C. | 350–400° C. |
| $CuBr_2$ | 350–500° C. | 400–450° C. |
| CuI | 400–600° C. | 450–550° C. |
| $YCl_3$ | 650–750° C. | 675–725° C. |
| $CaI_2$ | 700–900° C. | 750–850° C. |
| $SrI_2$ | 750–950° C. | 775–850° C. |
| $BaI_2$ | 850–1050° C. | 900–1000° C. |
| $BaCl_2$ | 950–1100° C. | 1000–1050° C. |
| $MgCl_2$ | 700–850° C. | 750–800° C. |
| Ba | 600–800° C. | 650–750° C. |

According to the process of the present invention, a film of a single crystalline high Tc (transition temperature) superconductive oxide can be obtained, whereby a film of a high Tc superconductive oxide having an excellent film quality, film uniformity and reproducibility, due to a high crystallinity such as crystal size and crystal orientation, can be deposited, and a result, by applying such a high quality superconductive oxide film to IC's, to various parts of devices, and to wiring, the yield and reliability thereof can be increased.

BRIEF DESCRIPTION OF THE DRAWINGS

FIG. 4 schematically illustrates the determination of an electrical resistance of a film;

DESCRIPTION OF THE PREFERRED EMBODIMENTS

The present invention is described below with reference to the drawings.

EXAMPLE 1

Figure 2:
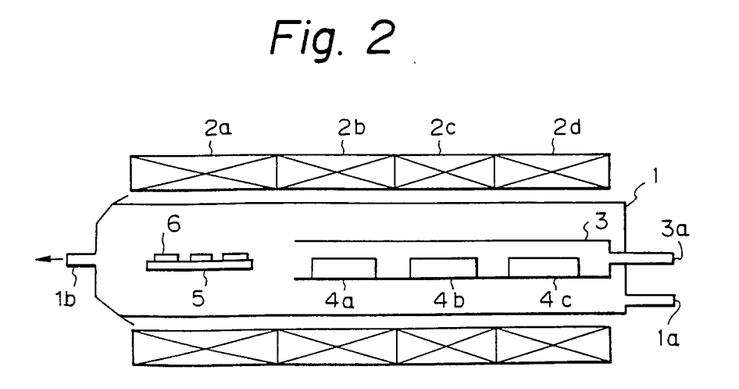
FIG. 2 is a sectional view of an apparatus for CVD.

FIG. 2 illustrates an apparatus for CVD used to obtain this example. In FIG. 2, a cylindrical reaction tube 1 is made of quartz and is heat resistant. The reaction tube 1 is surrounded by four resistance heaters 2a–2d, which generate heat by passing an electrical current therethrough to heat respective portions of the reaction tube 1. In the reaction tube 1, a source chamber 3 is arranged in which three source boats 4a–4c are placed. The source boats 4a–4c contain $BaCl_2$, $YCl_3$, and $CuCl$, respectively, and release $BaCl_2$ gas, $YCl_3$ gas, and $CuCl$ gas, respectively, when heated by the heaters 2b–2d.

The source chamber 3 has a small-diameter gas inlet port 3a at one end of the chamber 3, through which helium gas as a carrier gas is introduced. The other end of the source chamber 3 is open, and a substrate supporter 5 is placed near that other end at a predetermined distance therefrom. The substrate supporter 5 is made of quartz or ceramics, and substrates 6 on which a superconductive oxide is to be deposited are mounted on the substrate supporter 5. The reaction tube 1 also has a small diameter gas inlet port 1a at one end of the reaction tube 1, through which helium gas as a carrier gas, as well as carbon dioxide gas and hydrogen gas serving as a reducing agent, are introduced into the reaction chamber 1. The reaction chamber 1 has an outlet port 1b at the other end thereof for evacuating the gas in the reaction tube 1.

In the operation to obtain this example, first, substrates 6 are mounted on the supporter 5 and $BaCl_2$, $YCl_3$, and $CuCl$ are placed in the source boats 4a to 4c, respectively. Then, the reaction tube 1 is heated by the resistance heaters 2a to 2d to release $BaCl_2$ gas, $YCl_3$ gas, and $CuCl$ gas while a carrier gas (He) is introduced through the gas inlet port 3a into the source chamber 3 to carry the released gases over the substrates 6. Also, a carrier gas (He) as well as $CO_2$ and $H_2$ gases are introduced through the gas inlet port 1a into the reaction tube 1 outside the source chamber 3 and passed over the substrates 6 while the substrates 6 are heated by the resistance heater 2a, and as a result, oxidation and reduction reactions occur over or near the substrates and a high temperature superconductive oxide film of $YBa_2Cu_3O_{7-x}$ is deposited on the substrates 6 by the following chemical reaction.

$$YCl_3 + 2BaCl_2 + 3CuCl + 7CO_2 + 5H_2 \rightarrow YBa_2Cu_3O_{7-x} + 7CO + 10HCl$$

The particular conditions for deposition are as follows.

Temperature of substrates ($T_{sub}$): 950°–1200° C.
Temperature of $BaCl_2$ ($T_{Ba}$): 950°–1100° C.
Temperature of $YCl_3$ ($T_y$): 650°–750° C.
Temperature of $CuCl$ ($T_{Cu}$): 300°–500° C.
$CO_2$ concentration: 0.01–10% of He concentration
$H_2$ concentration: 0.01–10% of He concentration
Flow rate of He carrying $CO_2$ and $H_2$: 5–20 l/min
Flow rate of He carrying $BaCl_2$, etc.: 5–20 l/min
Pressure: 760 mmHg
Substrate: (1̄102) sapphire, (100)MgO, (100)$SrTiO_3$, (100)$MgO.Al_2O_3$, and MgO on $MgO.Al_2O_3$ on Si
Thickness of deposited film: 0.2–5 μm In this operation, the heating temperatures of the $CuCl$, $YCl_3$, $BaCl_2$ and the substrates are selected such that these temperatures increase from $T_{Cu}$ to $T_y$ to $T_{Ba}$ to $T_{sub}$. Namely, the arrangement of $CuCl$, $YCl_3$, and $BaCl_2$ in the source boats 4c to 4a should be such that the heating temperatures of the heaters 4a to 4c are increased from 4c to 4b to 4a, in that order.

Figure 3:
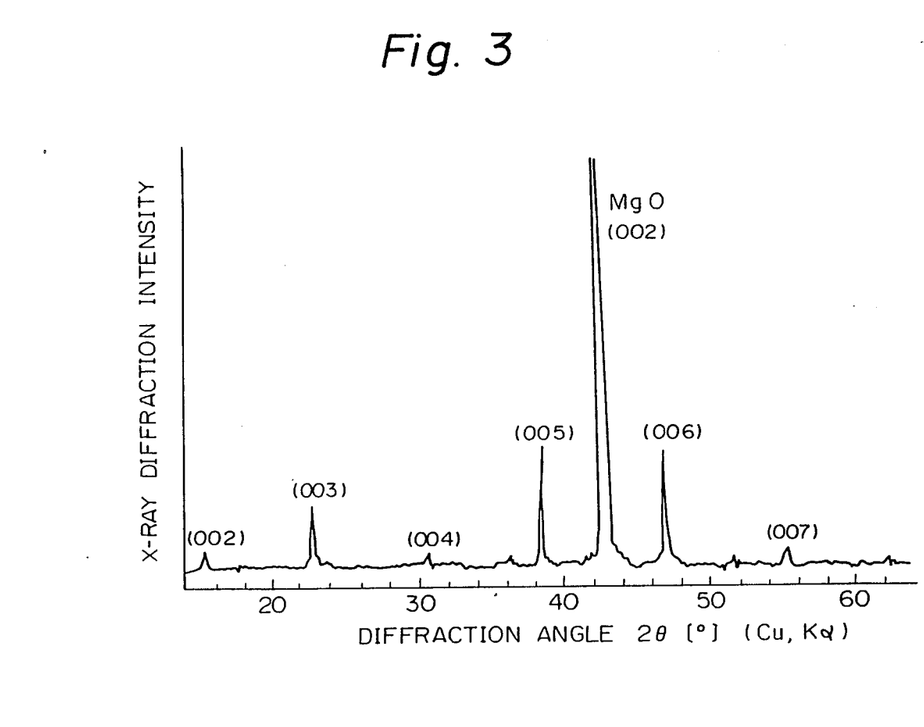
FIG. 3 is an X-ray diffraction pattern of a $YBa_2Cu_3O_{7-x}$ film formed in Example 1.

The obtained $YBa_2Cu_3O_{7-x}$ film is annealed in an oxygen atmosphere in the reaction tube 1 with the heater 2a maintained at 850° C. for 8 hours, and then gradually cooled. FIG. 3 shows an X-ray diffraction pattern of the thus-obtained film on a (100)MgO substrate with Cu, Kα ray. This pattern clearly demonstrates a formation of (001)$YBa_2Cu_3O_{7-x}$ on (100)MgO.

Figure 4:
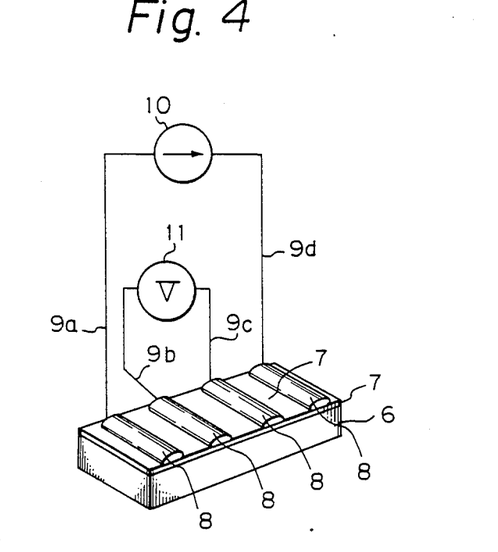
FIG. 4 is a photograph of the electron diffraction pattern of film shown in FIG. 3.

Next, as shown in FIG. 4, the substrate 6 on which the $YBa_2Cu_3O_{7-x}$ film 7 is formed is cut into pieces measuring 5 mm × 10 mm, after annealing.

Four probes 8 are formed by silver paste on this film 7, and wirings 9a to 9d with a constant electric current source 10 and a voltage meter 11 are connected to the probes 8.

Figure 5:
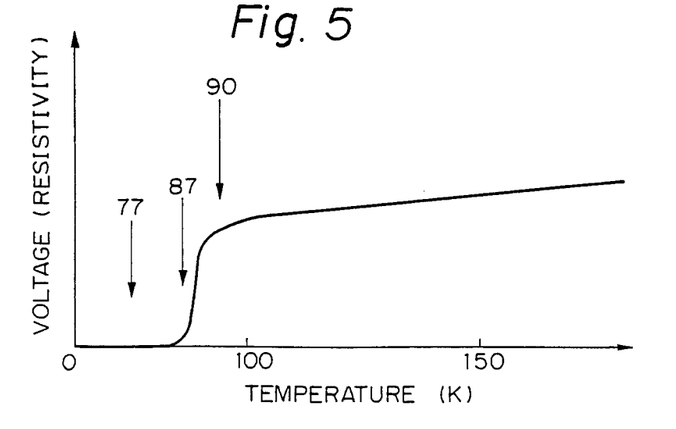
FIG. 5 is a an graph of an electrical resistance of the film formed in Example 1, with respect to temperature.

The electrical resistance of the film 7 is then determined with respect to the temperature, and as shown in FIG. 5 the electrical resistance rapidly decreases at about 90K and reaches a zero electrical resistance at about 87K, demonstrating the existence of a superconductive state. The conditions of forming this film are $T_{sub} = 1000°$ C., $T_{Ba} = 1000°$ C., $T_y = 670°$ C., and $T_{Cu} = 350°$ C. The superconductive behavior was also confirmed for other films formed under other conditions.

Accordingly, an excellent single crystalline high temperature superconductive oxide film can be easily formed in accordance with the present invention.

Figure 6:
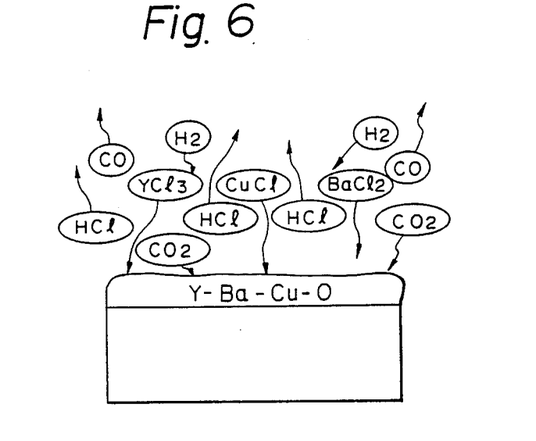
FIG. 6 schematically illustrates the deposition of a Y-Ba-Cu-O system film deposited by CVD.

FIG. 6 schematically illustrates the process of this deposition, wherein gases of $YCl_3$, $CuCl$, $HCl$, $BaCl_2$, $H_2$, $CO$, $CO_2$, etc., chemically react with each often over the substrate to uniformly deposit a film of a compound of a Y-Ba-Cu-O system on the substrate.

EXAMPLE 2

In this example, $O_2$ and $H_2$ are used as the oxidizing and reducing agents instead of the $CO_2$ and $H_2$ used in Example 1. The operation of forming a superconductive oxide film is carried out in the same way as in Example 1, except that the following conditions prevail.

$T_{sub}$: 900° C.
$T_{Ba}$: 900° C.
$T_y$: 630° C.
$T_{Cu}$: 320° C.
$O_2$ concentration: 0–30% of He
Bubbling temperature: 20° C.
Substrate: (1̄102)sapphire, (100)MgO, (100)$SrTiO_3$, (100)$MgO.Al_2O_3$, and MgO on $MgO.Al_2O_3$ on Si
Flow rate of He carrying $O_2$ and $H_2O$: 15 l/min
Flow rate of He carrying $BaCl_2$ etc.: 15 l/min
Thickness of deposited film: 0.2–5 μm
* Water is bubbled with a part or a whole of a carrier gas.

After the deposition of a Y-Ba-Cu-O system film, the film is annealed in an oxygen atmosphere as in Example 1, and as a result, a single crystalline film of $YBa_2Cu_3O_{7-x}$ exhibiting superconductive behavior was obtained.

Note that the $CO_2$ and $H_2$ used as oxidizing and reducing agents in Example 1 must be selected with great care and the conditions of the operation must be strictly controlled, since $O_2$ has a weak oxidizing effect and $H_2$ has a strong reducing effect, and thus the deposited film can be reduced from an oxide to a metal. In comparison with this, the use of $O_2$ and $H_2$ permits a less careful selection and easier control of the conditions of operation.

EXAMPLE 3

The deposition of a $YBa_2Cu_3O_{7-x}$ film was carried out as in Examples 1 and 2, but $BaBr_2$ or $BaI_2$ was used instead of $BaCl_2$, $YF_3$ or $YBr_3$ instead of $YCl_3$, and $CuF$, $CuF_2$, $CuCl_2$, $CuBr$, $CuBr_2$ or $CuI$ instead of $CuCl$.

The resultant films also proved to be excellent single crystalline superconductive oxide films.

EXAMPLE 4

The deposition of a YBa$_2$Cu$_3$O$_{7-x}$ film was carried out as in Example 2, but Ba was used instead of BaCl$_2$. The conditions of operation were as follows:
  T$_{sub}$: 900° C.
  Temperature of Ba (T$_{Ba}$): 700° C.
  T$_y$: 630° C.
  T$_{Cu}$: 320° C.
  Flow rate of He carrying Ba etc.: 15 l/min
  O$_2$ concentration: 0–30% of He
  Bubbling temperature: 0°–100° C.
  Flow rate of He carrying O$_2$ and H$_2$: 15 l/min
  Substrate: (1̄102)sapphire, (100)MgO, (100)SrTiO$_3$, (100)MgO.Al$_2$O$_3$, and MgO on MgO.Al$_2$O$_3$ on Si
  Thickness of deposited film: 0.2–5 μm After the deposited film was annealed in an oxygen atmosphere, a single crystalline YBa$_2$Cu$_3$O$_{7-x}$ film exhibiting superconductive behavior was obtained.

EXAMPLE 5

Using the same procedures as in the above Examples, a film of a compound having a composition of LnBa$_2$Cu$_3$O$_{7-x}$ where Ln is a lanthanide element was deposited on a substrate by using a halide of a lanthanide element instead of a halide of yttrium. The lanthanide element included Nd, Sm, Eu, Gd, Tb, Dy, Ho, Er, Tm, and Yb. Two or more lanthanide elements could be used in combination. The halide of the lanthanide element includes the chloride, bromide, and iodide of the element.

The thus obtained LnBa$_2$Cu$_3$O$_{7-x}$ film was also a single crystalline superconductive oxide film exhibiting superconductive behavior at about 90K.

EXAMPLE 6

Figure 7:
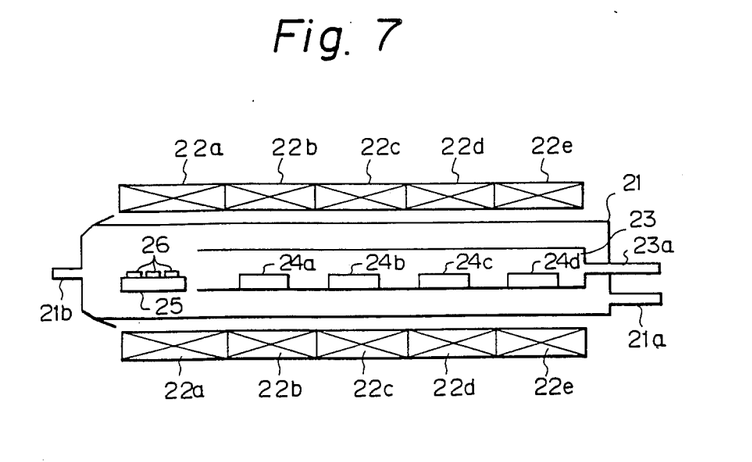
FIG. 7 is a sectional view of another CVD apparatus.

FIG. 7 illustrates the apparatus for CVD used in this Example for forming a film of Bi-Sr-Ca-Cu-O system superconductive oxide.

The structure of this apparatus is very similar to that of the apparatus in FIG. 2 except that, in this Example, four source boats and five resistance heaters are used.

In FIG. 7, reference numeral 21 denotes a reaction tube, 21a a gas inlet port, 21b a gas outlet port, 22a to 22e resistance heaters, 23 a source chamber, 23a a gas inlet port, 24a to 24d source boats, 25 a substrate supporter, and 26 substrates.

SrI$_2$, CaI$_2$, CuI and BiCl$_3$ were placed in the source boats 24a to 24d, respectively, and a carrier gas of He was introduced through the gas inlet port 23a into the source chamber 23. The substrates 26 were of (100)MgO. Through the gas inlet port 21a, another carrier gas of He in combination with O$_2$ and H$_2$ as the oxidizing and reducing agents was introduced into the reaction tube 21 outside the source chamber 23. The reaction gas was evacuated from the outlet port 21b.

Figure 8:
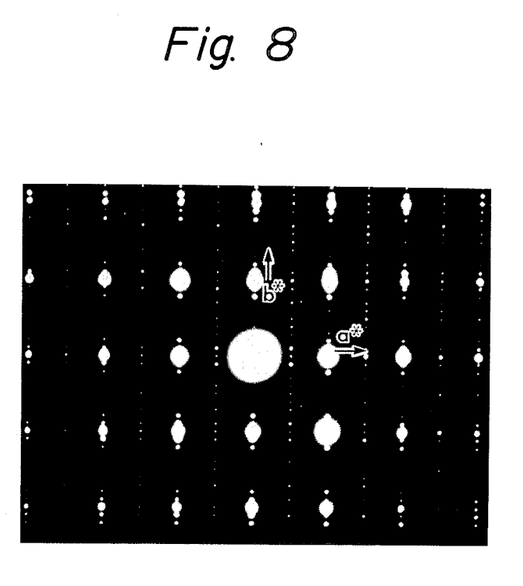
FIG. 8 is a photograph of the electron diffraction pattern of the film shown in FIG. 6.

The conditions of operation used for depositing a BiSrCaCuO$_x$ on a substrate were as follows:
  Temperature of substrates (T$_{sub}$): 750°–950° C.
  Temperature of SrI$_2$ source (T$_{Sr}$): 750°–950° C.
  Temperature of CaI$_2$ source (T$_{Ca}$): 700°–900° C.
  Temperature of CuI source (T$_{Cu}$): 400°–600° C.
  Temperature of BiCl$_3$ source (T$_{Bi}$): 150°–250° C.
  Flow rate of He carrying BiCl$_3$ etc: 10–20 l/min
  Flow rate of He carrying O$_2$ and H$_2$: 10–20 l/min
  Flow rate of O$_2$ gas: 10–5000 cc/min
  Bubbling temperature of H$_2$O: 23° C.
  Flow rate of He bubbling gas: 10–1000 cc/min
  Deposition rate: 3–30 nm/min
  Thickness of deposited film: 0.1–10 μm
  Oxygen annealing temperature: 400°–850° C.
  Oxygen annealing time: 30–60 minutes
  Substrate: (1̄102)sapphire, (100)MgO, (100)SrTiO$_3$, (100)MgO.Al$_2$O$_3$, and MgO on MgO.Al$_2$O$_3$ on Si FIG. 8 is a photograph of the transmission electron diffraction pattern of (100)BiSrCaCuOx on (100)MgO, which clearly demonstrates that the BiSrCaCuOx film definitely has a single crystalline form. This film was obtained under the conditions of T$_{sub}$=825° C., T$_{Bi}$=170° C., T$_{Sr}$=825° C., T$_{Cu}$=450° C., and T$_{ca}$=800° C.

Figure 9:
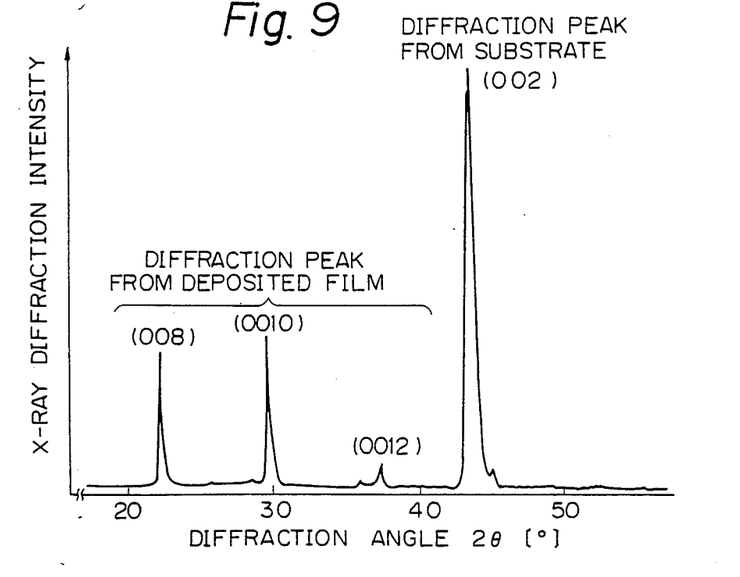
FIG. 9 is an X-ray diffraction pattern of the BiSr-$CaCuO_x$ film formed in Example 6.

FIG. 9 shows an X ray diffraction pattern obtained from a film deposited according to the above operation, with CuKα ray. In FIG. 9, in addition to the diffraction peaks of (100)MgO, diffraction peaks (008), (0010) and (0012), which stem from particular diffraction planes oriented to (100) of MgO were observed, and thus the formation of a single crystal of BiSrCaCuO$_x$ was confirmed. The particular conditions of operation for this film of FIG. 8 were;
  T$_{sub}$=825° C., T$_{Bi}$=170° C., T$_{sr}$=825° C., T$_{Ca}$=800° C., T$_{Cu}$=450° C.

Figure 10:
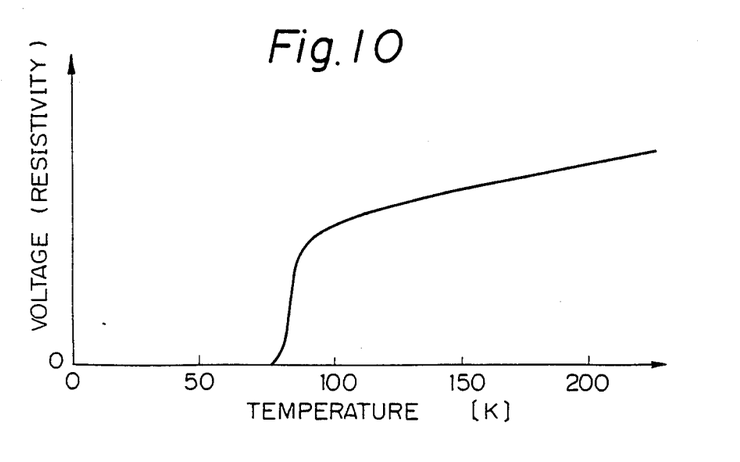
FIG. 10 is a graph of an electrical resistance of the film shown in FIG. 9, with respect to temperature; and, FIGS. 11 and 12 are CVD apparatuses which may be used in the process of the present invention.

The electrical resistance of the film obtained above was determined with respect to the temperature, in the same manner as described before with reference to FIG. 4. The result is shown in FIG. 10, in which the electrical resistance rapidly decreases at about 90K and reaches a zero electrical resistance at about 77K, thus exhibiting a superconductive state.

EXAMPLE 7

In the same way as in Example 6, other QZ$^1$Z$^2$CuO$_x$ films were deposited, where Q stands for a group VA metal of the periodic table, and Z$^1$ and Z$^2$ stand for a alkali earth metal. The group VA metal may be Sb or Bi and the alkali earth metal may be Ba, Mg, Be, etc. The obtained QZ$^1$Z$^2$CuO$_x$ films were single crystalline and exhibited superconductive behavior.

Note that a high temperature superconductive film of BiSrCaCuO$_x$ can be deposited at about 800° C., which is about 100°–200° C. lower than that for a film of YBa$_2$Cu$_3$O$_{7-x}$, and as a result, during the deposition of a BiSrCaCuO$_x$ film, a mutual reaction between the substrate and the deposited film is prevented, giving a superconductive film having an abrupt interface. This advantageously enhances the performance of elements for which the interface characteristics thereof are important, such as a Josephson element and a superconductive transistor, etc.

Figure 11:
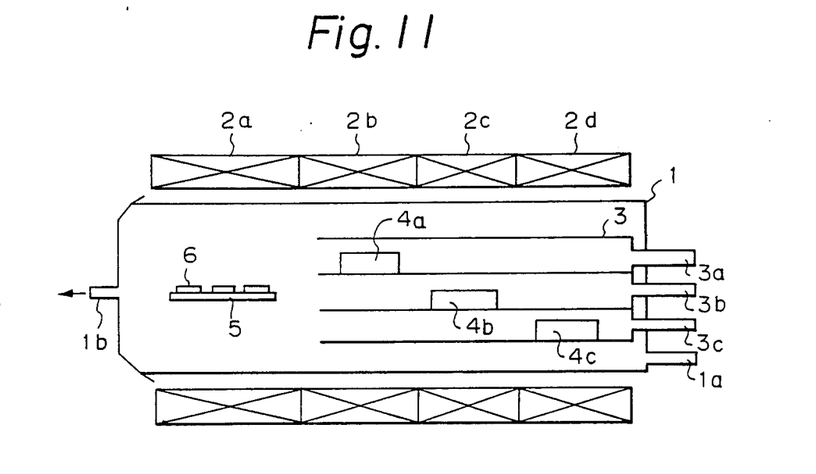

Although only one source chamber 3 or 23 was used in the apparatus for CVD in FIG. 2 and 7, a plurality of source chambers may be used for each source, for example, as shown in FIG. 11.

The CVD apparatus shown in FIG. 11 is the same as that in FIG. 2 except that three source chambers 3—1 to 3—3 are provided in which sources 4a to 4c are arranged, respectively. In this apparatus in FIG. 11, the temperature control of the three sources 4a to 4c is similar to that for the apparatus of FIG. 2, but the flow rates of the respective source gases can be separately controlled, which allows a more precise control of the amount or flow rate of sources gases.

Figure 12:
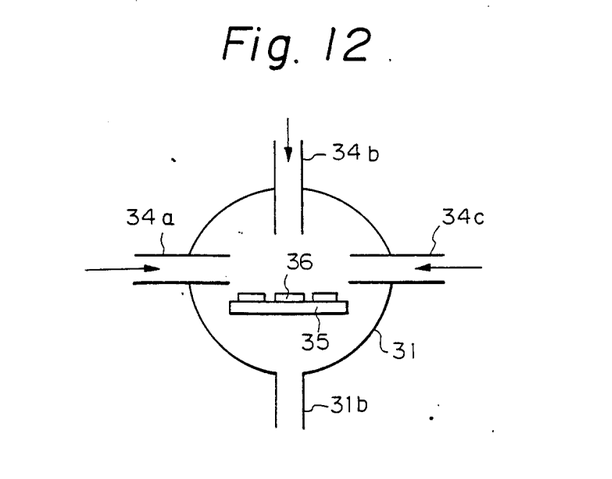

FIG. 12 schematically illustrates another CVD apparatus which may be used for the process of the present invention. In this apparatus, source gases are separately formed and fed to a reactor 31. The source feeding lines 34a to 34c are separated and separately heated, so that each source gas can be fed to the reactor 31 at a desired temperature and a desired flow rate. In this configuration, the temperature of a source gas can be selected regardless of the temperatures of the other source gases.

We claim:

1. A process for chemical vapor deposition of an oxide superconductive film on a substrate, wherein the substrate is held in a reaction chamber and heated to a first temperature in a range from 750° to 1200° C., said process comprising the steps of:
    (a) flowing a mixture of vapors introduced at a position over the substrate in the reaction chamber, said mixture of vapors consisting essentially of a halide of a rare earth metal, one of an alkali earth metal selected from the group consisting of magnesium, calcium, strontium and barium or the corresponding halide thereof, and a halide of copper, at a second temperature equal to or less than the first temperature and being in a range of 700° to 1200° C.; wherein said mixture of vapors introduced into the reaction chamber is formed by:
    (b) heating the rare earth metal halide at a temperature of 630° to 750° C. to form a vapor of the rare earth metal halide;
    (c) heating the alkali earth metal or alkali earth metal halide at a temperature of 600° to 1100° C. to form a vapor of the alkali earth metal or alkali earth metal halide;
    (d) heating the copper halide at a temperature of 300° to 600° C. to form a vapor of the copper halide, the heating temperatures used for vaporizing the components being less than the first temperature;
    (e) arranging the three vapor sources of the rare earth metal halide, the alkali earth metal or halide thereof and the copper halide, in a passage such that the copper halide vapor source is the farthest upstream and the vapor source of the alkali earth metal or the halide thereof is the farthest downstream in the passage;
    (f) heating the passage increasingly from upstream to downstream to the second temperature;
    (g) flowing a carrier gas over the vapor sources in the passage downstream toward the substrate;
    (h) introducing an oxygen source gas at position over the substrate in the reaction chamber, the vapor mixture and oxygen oxygen source gas being separated from each other until they approach a point near the substrate at which the vapor mixture and the oxygen source gas come into contact with each other and are heated to the first temperature to cause a reaction between the vapor mixture and the oxygen source gas; and
    (i) depositing a superconducting oxide of a rare earth metal-alkali earth metal-copper-oxygen system on the substrate.

2. A process according to claim 1, wherein the superconductive oxide is represented by the formula $X_1Z_2CuO_x$ where X stands for at least one rare earth metal, Z stands for at least one alkali earth metal, and x has a value different from the stoichiometric value.

3. A process according to claim 1, wherein the mixture of vapors is carried by a carrier gas.

4. A process according to claim 1, wherein the oxygen source gas further contains hydrogen as a reaction accelerator.

5. A process according to claim 1, wherein the oxygen source gas is selected from the group consisting of oxygen, carbon dioxide and water vapor.

6. A process according to claim 1, wherein the rare earth halide is yttrium chloride and the yttrium chloride is heated at a temperature of from 650° to 750° C.

7. A process according to claim 6, wherein the yttrium chloride is heated at a temperature of from 675° to 725° C.

8. A process according to claim 1, wherein the alkali earth metal halide is calcium iodide and the calcium iodide is heated at a temperature of from 700° to 900° C.

9. A process according to claim 8, wherein the calcium iodide is heated at a temperature of from 750° to 850° C.

10. A process according to claim 1, wherein the alkali earth metal halide is strontium iodide and the strontium iodide is heated at a temperature of from 750° to 950° C.

11. A process according to claim 10, wherein the strontium iodide is heated at a temperature of from 775° to 850° C.

12. A process according to claim 1, wherein the alkali earth metal halide is barium iodide and the barium iodide is heated at a temperature of from 850° to 1050° C.

13. A process according to claim 12, wherein the barium iodide is heated at a temperature of from 900° to 1000° C.

14. A process according to claim 1, wherein the alkali earth metal halide is barium chloride and the barium chloride is heated at a temperature of from 950° to 1100° C.

15. A process according to claim 14, wherein the barium chloride is heated at a temperature of from 1000° to 1050° C.

16. A process according to claim 1, wherein the alkali earth metal halide is magnesium chloride and the magnesium chloride is heated at a temperature of from 700° to 850° C.

17. A process according to claim 16, wherein the source of magnesium chloride is heated at a temperature of from 750° to 800° C.

18. A process according to claim 1, wherein the copper halide is copper chloride and the copper halide is heated at a temperature of from 300° to 500° C.

19. A process according to claim 18, wherein the copper chloride is heated at a temperature of from 350° to 400° C.

20. A process according to claim 1, wherein the copper halide is copper bromide and the copper bromide is heated at a temperature of from 350° to 500° C.

21. A process according to claim 20, wherein the copper bromide is heated at a temperature of from 400° to 450° C.

22. A process according to claim 1, wherein the copper halide is copper iodide and the copper iodide is heated at a temperature of from 400° to 600° C.

23. A process according to claim 22, wherein the copper iodide is heated at a temperature of from 450° to 550° C.

24. A process according to claim 1, wherein the alkali earth metal is barium and the barium metal is heated at a temperature of from 600° to 800° C.

25. A process according to claim 24, wherein the barium metal is heated at a temperature of from 650° to 750° C.

26. A process according to claim 1, wherein the three vapor sources of the rare earth metal halide, the alkali earth metal halide or the alkali earth metal, and the copper halide are arranged in separate passages and heated to the temperatures of 630°–750° C., 600°–1100° C. and 300°–600° C., respectively in the respective passages, the passages being directed toward the substrate, and carrier gases flowing through the passages toward the substrate.

27. A process according to claim 26, wherein the passages of the three vapor sources of the rare earth metal halide, the alkali earth metal halide or the alkali earth metal, and the copper halide pass through a furnace having first to third zones in the direction of the flow of the carrier gases, the three sources being arranged in the first to third zones on a one-to-one basis, the first to third zones having temperatures increasing from the first to third zones.

28. A process according to claim 1, wherein the substrate is of single crystalline magnesium oxide.

29. A process according to claim 1, wherein the substrate has a buffer layer on a surface thereof, the buffer layer being of one selected from the group consisting of magnesium oxide, barium fluoride, and magnesium spinel on silicon substrate.

30. A process for chemical vapor deposition of an oxide superconductive film on a substrate, wherein the substrate is held in a reaction chamber and heated to a first temperature in a range of 750° to 1100° C., said process comprising the steps of:
(a) introducing a mixture of vapors to a position over the substrate in the reaction chamber, said mixture of vapors consisting essentially of a halide of a group VA metal, halides of two alkali earth metals selected from the group consisting of magnesium, calcium, strontium and barium, and a halide of copper, at a second temperature equal to or less than the first temperature and being in a range of 700° to 1100° C.; wherein said mixture of vapors introduced into the reaction chamber is formed by:
(b) heating the halide of the group VA metal at a temperature of 150° to 250° C. to form a vapor of the halide of the group VA metal;
(c) heating the two alkali earth metal halides at temperatures of 600° to 1100° C. to form vapors of the alkali earth metal halides;
(d) heating the copper halide at a temperature of 300° to 600° C. to form a vapor of the copper halide, the heating temperatures used for vaporizing the components being less than said first temperature;
(e) arranging the four vapor sources of the halide of the group VA metal, the halides of two alkali earth metals and the copper halide in a passage such that the vapor source of the halide of the group VA metal is the farthest upstream and the vapor sources of the two alkali earth metal halide are farthest downstream in the passage;
(f) heating the passage increasingly from upstream to downstream to the second temperature;
(g) flowing a carrier gas over the vapor sources in the passage downstream toward the substrate;
(h) introducing an oxygen source gas at a position over the substrate in the reaction chamber, the vapor mixture and the oxygen source gas being separated from each other until they approach a point near the substrate at which the vapor mixture and the oxygen source gas contact each other and are heated to the first temperature to cause a reaction therebetween; and
(j) depositing a superconductive oxide of a group VA metal—an alkali earth metal—an alkali earth metal-copper-oxide system on the substrate.

31. A process according to claim 30, wherein the superconductive oxide is represented by the formula $QZ^1Z^2Cu_yO_3$, where Q stands for a metal of the VA group of the periodic table, $Z^1$ and $Z^2$ stand for an alkali earth metal, y has a value of about 2 or about 1.5, x has a value different from the stoichiometric value.

32. A process according to claim 30, wherein the mixture of vapors is carried by a carrier gas.

33. A process according to claim 30, wherein the oxygen source gas further contains hydrogen as a reaction accelerator.

34. A process according to claim 30, wherein the oxygen source gas is selected from the group consisting of oxygen, carbon dioxide and water vapor.

35. A process according to claim 28, wherein the halide of the metal of the VA group of the periodic table is bismuth halide and the bismuth halide is heated to a temperature of from 150° to 250° C.

36. A process according to claim 35, wherein the bismuth halide is heated to a temperature of from 170° to 200° C.

37. A process according to claim 30, wherein one of the alkali earth metal halides is calcium iodide and the calcium iodide is heated at a temperature of from 700° to 900° C.

38. A process according to claim 37, wherein the calcium iodide is heated at a temperature of from 750° to 850° C.

39. A process according to claim 30, wherein one of the alkali earth metal halides is strontium iodide and the strontium iodide is heated at a temperature of from 750° to 950° C.

40. A process according to claim 39, wherein the strontium iodide is heated at a temperature of from 775° to 850° C.

41. A process according to claim 30, wherein one of the alkali earth metal halide is barium iodide and the barium iodide is heated at a temperature of from 850° to 1050° C.

42. A process according to claim 41, wherein the barium iodide is heated at a temperature of from 900° to 1000° C.

43. A process according to claim 30, wherein one of the alkali earth metal halide is barium chloride and the barium chloride is heated at a temperature of from 950° to 1100° C.

44. A process according to claim 43, wherein the barium chloride is heated at a temperature of from 1000° to 1050° C.

45. A process according to claim 30, wherein one of the alkali earth metal halide is magnesium chloride and the magnesium is heated at a temperature of from 700° to 850° C.

46. A process according to claim 45, wherein the magnesium chloride is heated at a temperature of from 750° to 800° C.

47. A process according to claim 30, wherein the copper halide is copper chloride and the copper halide is heated at a temperature of from 300° to 500° C.

48. A process according to claim 47, wherein the copper chloride is heated at a temperature of from 350° to 400° C.

49. A process according to claim 30, wherein the copper halide is copper bromide and the copper bromide is heated at a temperature of from 350° to 500° C.

50. A process according to claim 49, wherein the copper bromide is heated at a temperature of from 400° to 450° C.

51. A process according to claim 30, wherein the copper halide is copper iodide the copper iodide is heated at a temperature of from 400° to 600° C.

52. A process according to claim 51, wherein the copper iodide is heated at a temperature of from 450° to 550° C.

53. A process according to claim 30, wherein the four vapor sources of the halide of the metal of the VA group, the alkali earth metal halides, and the copper halide are arranged in separate passages and heated to the temperatures of 150°–250° C., 600°–1100° C. and 300°–600° C. temperatures respectively in the respective passages, the passages being directed toward the substrate, and carrier gases flowing through the passages toward the substrate.

54. A process according to claim 53, wherein the passages of the four vapor sources of the halide of the metal of the VA group, the alkali earth metal halides, and the copper halide pass through a furnace having first to fourth zones in the direction of the flow of the carrier gases, the four sources being arranged in the first to fourth zones on a one-to-one basis, the temperatures of the first to fourth zones increasing from the first to fourth zones.

55. A process according to claim 30, wherein the substrate is of single crystalline magnesium oxide.

56. A process according to claim 30, wherein the substrate has a buffer-layer on a surface thereof, the buffer layer being of one selected from the group consisting of magnesium oxide, barium fluoride, and magnesium spinel on silicon.

57. A process for a chemical vapor deposition of an oxide superconductive film, comprising the steps of:
   (a) holding a substrate in a reaction chamber and heating the substrate to a first temperature in a range of 750° to 1200° C.;
   (b) introducing a mixture of vapors at a position over the substrate in the reaction chamber, said mixture of vapors consisting essentially of a yttrium chloride, one of an alkali earth metal or the corresponding halide thereof, and a halide of copper, at a second temperature equal to or less than the first temperature and being in a range of 600° to 1100° C.; wherein said mixture of vapors introduced into the reaction chamber is formed by:
   (c) heating the yttrium chloride at a temperature of 675° to 725° C. to form a vapor of the yttrium chloride;
   (d) heating one of the alkali earth metal halide and the halide thereof selected from calcium iodide at a temperature between 750°–850° C., strontium iodide at a temperature between 775°–850° C., barium iodide at a temperature between 900°–1000° C., barium chloride at a temperature between 1000°–1050° C., magnesium chloride at a temperature between 750°–800° C. and barium at a temperature between 650°–750° C., to form a vapor of the alkali earth metal or the halide thereof;
   (e) heating the copper halide selected form copper chloride at a temperature between 350°–400° C., copper bromide at a temperature between 400°–450° C. and copper iodide at a temperature between 450°–550° C., to form a vapor of the copper halide;
   (f) introducing an oxygen source gas at a position over the substrate in the reaction chamber, the vapor mixture and the oxygen source gas being separated from each other until they approach a point near the substrate at which the vapor mixture and the oxygen source gas contact each other and are heated to the first temperature to cause a reaction therebetween; and
   (g) depositing a superconductive oxide of yttrium-alkali earth metal-copper-oxygen system on the substrate.

58. A process according to claim 57, wherein said step (h) of heating the rare earth metal is formed by heating a source of yttrium chloride at a temperature between 675°–725° C., wherein said step (i) of heating one of the alkali earth metal and the alkali earth metal halide is formed by heating a source of calcium iodide at a temperature between 750°–850° C., strontium iodide at a temperature between 775°–850° C., barium iodide at a temperature between 900°–1000° C., barium chloride at a temperature between 1000°–1050° C., magnesium chloride at a temperature between 750°–800° C., and barium at a temperature between 650°–750° C., and wherein said step (j) of heating copper halide for forming a vapor of copper halide is formed by heating a source of copper chloride at a temperature between 300°–500° C., copper bromide at a temperature between 400°–450° C., and copper iodide at a temperature between 450°–550° C.

59. A process for chemical vapor deposition of an oxide superconductive film, comprising the steps of:
   (a) holding a substrate in a reaction chamber and heating the substrate to a temperature in a range of approximately 750°–1100° C.;
   (b) introducing a mixture of vapors at a position over the substrate in the reaction chamber, said mixture of vapors consisting essentially of a halide of bismuth, halides of two alkali earth metals and a halide of copper, at a second temperature equal to or less than the first temperature and being in a range of approximately 150°–1100° C.; wherein said mixture of vapors introduced into the reaction chamber is formed by:
   (c) heating the bismuth halide at a temperature between 170°–200° C. to form a vapor of the halide of bismuth;
   (d) heating the halides of the two alkali earth metals selected from calcium iodide at a temperature between 750°–850° C., strontium iodide at a temperature between 775°–850° C., barium chloride at a temperature between 1000°–1050° C., and magnesium chloride at a temperature between 750°–800° C., to form vapors of the two alkali earth metal halides; and
   (e) heating the copper halide selected from copper chloride at a temperature between 350°–400° C., copper bromide at a temperature between 400°–450° C., and copper iodide at a temperature between 450°–550° C., to form a vapor of the copper halide;
   (f) introducing an oxygen source gas at a position over the substrate in the reaction chamber, the vapor mixture and the oxygen source gas being separated from each other until they approach a point near the substrate at which the vapor mixture and the oxygen source gas contact each other and are heated to the first temperature to cause a reaction therebetween; and (g) depositing a superconductive oxide of bismuth- an alkali earth metal—an alkali earth metal-copper-oxygen system on the substrate.

60. A process according to claim 59, wherein said step (h) of forming a vapor of the halide of a group VA metal is formed by heating a source of bismuth halide at a temperature between 170°–200° C., wherein said step (i) of heating the two alkali earth metal halides to form vapors of the two alkali earth metal halides are formed by heating sources of one of calcium iodide at a temperature between 770°–850° C., strontium iodide at a temperature of 775°–850° C., barium iodide at a temperature between 900°–1000° C., barium chloride at a temperature between 1000°–1050° C. and magnesium at a temperature between 750°–800°, and wherein said step (j) of heating copper halide to form vapors of copper halide is formed by heating a source of one of copper chloride at a temperature between 350°–400° C., copper bromide at a temperature between 400°–450° C., or copper iodide at a temperature between 450°–550° C.

* * * * *